(12) United States Patent
Pressburger et al.

(10) Patent No.: US 11,315,816 B2
(45) Date of Patent: Apr. 26, 2022

(54) LOCALIZED PURGE MODULE FOR SUBSTRATE HANDLING

(71) Applicant: KLA Corporation, Milpitas, CA (US)

(72) Inventors: Tzachi Pressburger, Kfar haHoresh (IL); Igor Volkov, Kiryat Bialik (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/018,912

(22) Filed: Sep. 11, 2020

(65) Prior Publication Data

US 2021/0391200 A1 Dec. 16, 2021

Related U.S. Application Data

(60) Provisional application No. 63/037,008, filed on Jun. 10, 2020.

(51) Int. Cl.
*H01L 21/673* (2006.01)
*H01L 21/677* (2006.01)
*H01L 21/687* (2006.01)

(52) U.S. Cl.
CPC .. *H01L 21/67393* (2013.01); *H01L 21/67766* (2013.01); *H01L 21/68707* (2013.01)

(58) Field of Classification Search
CPC ......... H01L 21/67393; H01L 21/67766; H01L 21/68707; H01L 21/67742; H01L 21/67748; H01L 21/67778
See application file for complete search history.

(56) References Cited

U.S. PATENT DOCUMENTS

| | | | |
|---|---|---|---|
| 7,542,127 B2 | 6/2009 | Sengers et al. |
| 7,755,764 B2 | 7/2010 | Kwak et al. |
| 8,830,486 B2 | 9/2014 | Kwak et al. |
| 9,244,368 B2 | 1/2016 | Delgado et al. |
| 9,257,320 B2 | 2/2016 | Fosnight et al. |
| 9,488,924 B2 | 11/2016 | Abramson et al. |
| 10,359,743 B2 | 7/2019 | Rice et al. |
| 10,451,542 B2 | 10/2019 | Doyle et al. |
| 10,593,580 B2 | 3/2020 | Woo |
| 2015/0235885 A1 | 8/2015 | Iwamoto |
| 2016/0033399 A1 | 2/2016 | Klassen et al. |

(Continued)

FOREIGN PATENT DOCUMENTS

| | | |
|---|---|---|
| JP | H06326036 A | 11/1994 |
| JP | 2003092335 A | 3/2003 |

(Continued)

OTHER PUBLICATIONS

PCT/US2021/035055, International Search Report, dated Sep. 8, 2021.

(Continued)

*Primary Examiner* — Glenn F Myers
(74) *Attorney, Agent, or Firm* — Huse IP Law; Charles C. Huse

(57) ABSTRACT

A substrate-handling robot includes an end-effector to support a substrate and an arm, coupled to the end-effector, to translate the end-effector between an extended position and a retracted position. The substrate-handling robot also includes an enclosure to at least partially enclose the substrate with the substrate on the end-effector in the retracted position. The enclosure includes a shower to provide a flow of purge gas to the substrate.

20 Claims, 5 Drawing Sheets

(56) References Cited

U.S. PATENT DOCUMENTS

| | | | |
|---|---|---|---|
| 2018/0174875 A1 | 6/2018 | Kim et al. | |
| 2019/0139801 A1* | 5/2019 | Liu et al. | |
| 2019/0206704 A1* | 7/2019 | Kisakibaru | B06B 1/0607 |
| 2020/0135499 A1* | 4/2020 | Pannese | B01D 46/0039 |
| 2020/0135521 A1* | 4/2020 | Reuter | H01L 21/67389 |
| 2020/0194287 A1* | 6/2020 | Hirochi | H01L 21/67748 |
| 2020/0211871 A1* | 7/2020 | Ryu | H01L 21/67196 |

FOREIGN PATENT DOCUMENTS

| | | | | |
|---|---|---|---|---|
| JP | 2009023021 A | 2/2009 | | |
| JP | 6226190 B2 | 11/2017 | | |
| KR | 20040013965 A | 2/2004 | | |
| WO | WO-2010035385 A1 * | 4/2010 | | H01L 21/67167 |

OTHER PUBLICATIONS

PCT/US2021/035055, Written Opinion of the International Searching Authority, dated Sep. 8, 2021.

* cited by examiner

300 ⟶

```
┌─────────────────────────────────────────────────────────────────────────────┐
│ Load a substrate onto an end-effector coupled to an arm, with the arm in an │
│ extended position. (302)                                                    │
│  ┌───────────────────────────────────────────────────────────────────────┐  │
│  │           Pick up a semiconductor wafer with a fork. (304)            │  │
│  └───────────────────────────────────────────────────────────────────────┘  │
└─────────────────────────────────────────────────────────────────────────────┘
                                      │
                                      ▼
┌─────────────────────────────────────────────────────────────────────────────┐
│ Retract the arm to a retracted position. At least partially enclose the     │
│ substrate in an enclosure that includes a shower. (306)                     │
│  ┌───────────────────────────────────────────────────────────────────────┐  │
│  │            The shower includes a porous surface. (308)                │  │
│  │  ┌─────────────────────────────────────────────────────────────────┐  │  │
│  │  │ The enclosure has a top portion with an inner surface that      │  │  │
│  │  │ includes the porous surface. Position a surface of the          │  │  │
│  │  │ substrate to face the inner surface. (310)                      │  │  │
│  │  └─────────────────────────────────────────────────────────────────┘  │  │
│  │  ┌─────────────────────────────────────────────────────────────────┐  │  │
│  │  │ The enclosure has a side wall with an inner surface that        │  │  │
│  │  │ includes the porous surface. Position the substrate adjacent    │  │  │
│  │  │ to the inner surface. (312)                                     │  │  │
│  │  └─────────────────────────────────────────────────────────────────┘  │  │
│  └───────────────────────────────────────────────────────────────────────┘  │
└─────────────────────────────────────────────────────────────────────────────┘
                                      │
                                      ▼
┌─────────────────────────────────────────────────────────────────────────────┐
│      Provide a flow of purge gas through the shower to the substrate. (314) │
│  ┌───────────────────────────────────────────────────────────────────────┐  │
│  │         Cause the purge gas to flow through the porous surface. (316) │  │
│  │  ┌─────────────────────────────────────────────────────────────────┐  │  │
│  │  │ Provide the purge gas through one or more tubes to a chamber    │  │  │
│  │  │ that is surrounded by surfaces that include the porous          │  │  │
│  │  │ surface. (318)                                                  │  │  │
│  │  └─────────────────────────────────────────────────────────────────┘  │  │
│  └───────────────────────────────────────────────────────────────────────┘  │
└─────────────────────────────────────────────────────────────────────────────┘
                                      │
                                      ▼
┌─────────────────────────────────────────────────────────────────────────────┐
│ Rotate a rotatable platform on which the arm and the enclosure are mounted  │
│ from a first orientation to a second orientation. Provide the flow of purge │
│ gas through the shower to the substrate while rotating the rotatable        │
│ platform. (320)                                                             │
└─────────────────────────────────────────────────────────────────────────────┘
                                      │
                                      ▼
┌─────────────────────────────────────────────────────────────────────────────┐
│ Move the substrate to a station: extend the arm from the retracted position │
│ to the extended position, thereby removing the substrate from the           │
│ enclosure. (322)                                                            │
└─────────────────────────────────────────────────────────────────────────────┘
```

Figure 3

LOCALIZED PURGE MODULE FOR SUBSTRATE HANDLING

RELATED APPLICATION

This application claims priority to U.S. Provisional Patent Application No. 63/037,008, filed on Jun. 10, 2020, which is incorporated by reference in its entirety for all purposes.

TECHNICAL FIELD

This disclosure relates to substrate handling (e.g., semiconductor-wafer handling), and more specifically to gas purging in a substrate-handling system.

BACKGROUND

A tool for fabricating or inspecting a substrate (e.g., a semiconductor wafer) may include an equipment front-end module. The equipment front-end module includes a robot that is used to move substrates between various stations in the tool. The equipment front-end module may be purged using a purge gas (e.g., nitrogen), to provide a desired environment for the substrates handled by the robot. For example, purging is performed to remove oxygen from the equipment front-end module.

Traditionally, the entire equipment front-end module is purged. Such purging, however, uses a high flow of purge gas and is expensive. Purging the entire equipment front-end module also does not provide precise environmental control near the substrate.

SUMMARY

Accordingly, there is a need for improved systems and methods of performing gas purging for substrates being handled by a robot.

In some embodiments, a substrate-handling robot includes an end-effector to support a substrate and an arm, coupled to the end-effector, to translate the end-effector between an extended position and a retracted position. The substrate-handling robot also includes an enclosure to at least partially enclose the substrate with the substrate on the end-effector in the retracted position. The enclosure includes a shower to provide a flow of purge gas to the substrate.

In some embodiments, a method includes loading a substrate onto an end-effector coupled to an arm, with the arm in an extended position. With the substrate loaded onto the end-effector, the arm is retracted to a retracted position. Retracting the arm includes at least partially enclosing the substrate in an enclosure with a shower. With the substrate at least partially enclosed in the enclosure, a flow of purge gas is provided through the shower to the substrate.

BRIEF DESCRIPTION OF THE DRAWINGS

For a better understanding of the various described implementations, reference should be made to the Detailed Description below, in conjunction with the following drawings.

FIG. 3 is a flowchart showing a substrate-handling method in accordance with some embodiments.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1A:
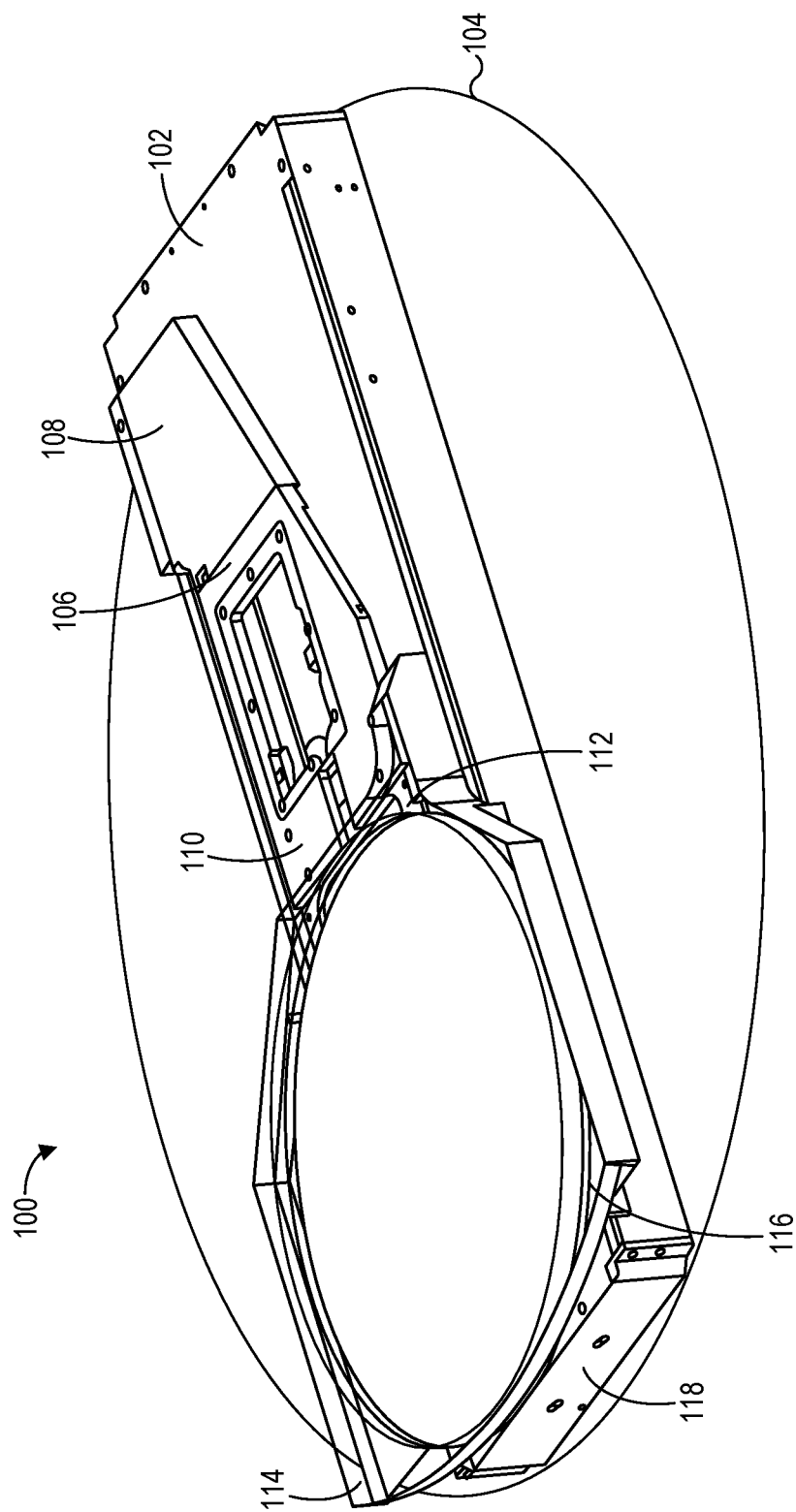
FIG. 1A is a perspective view of a substrate-handling robot, with a substrate on an end effector at a retracted position, in accordance with some embodiments.
Figure 1B:
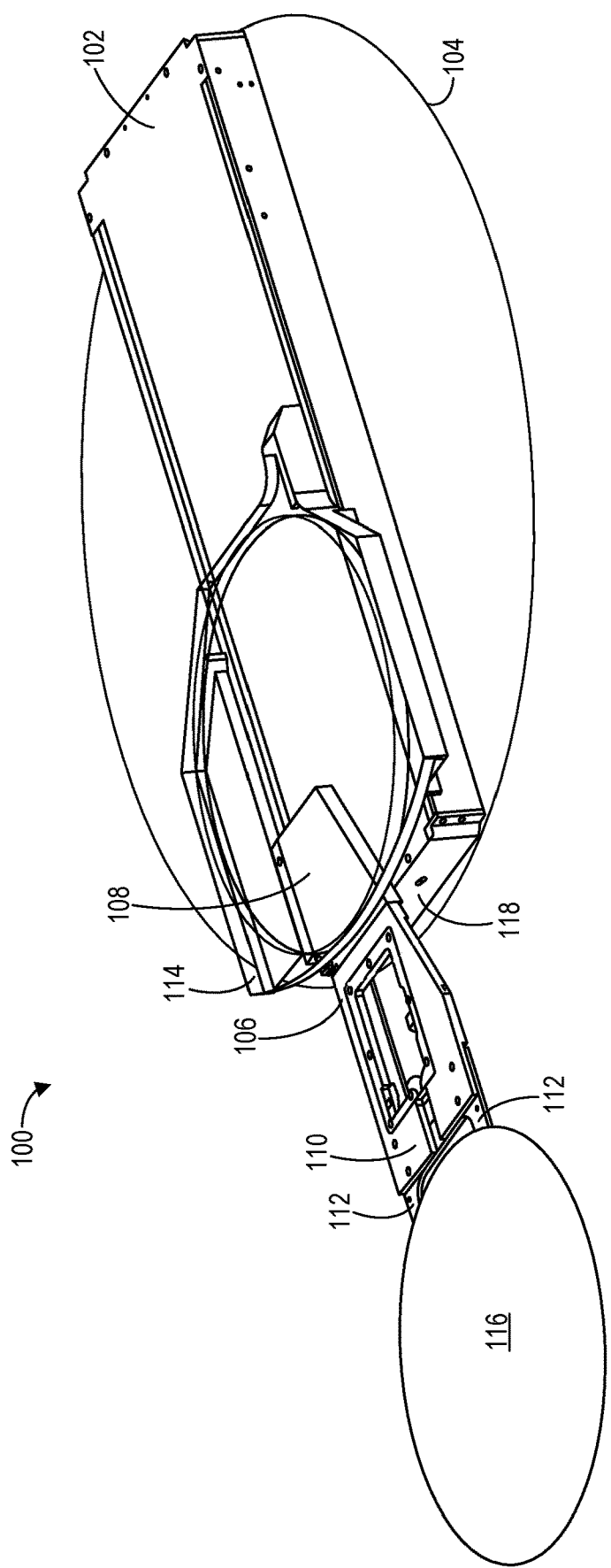
FIG. 1B is a perspective view of the substrate-handling robot of FIG. 1A, with the substrate on the end effector at an extended position, in accordance with some embodiments.
Figure 1C:
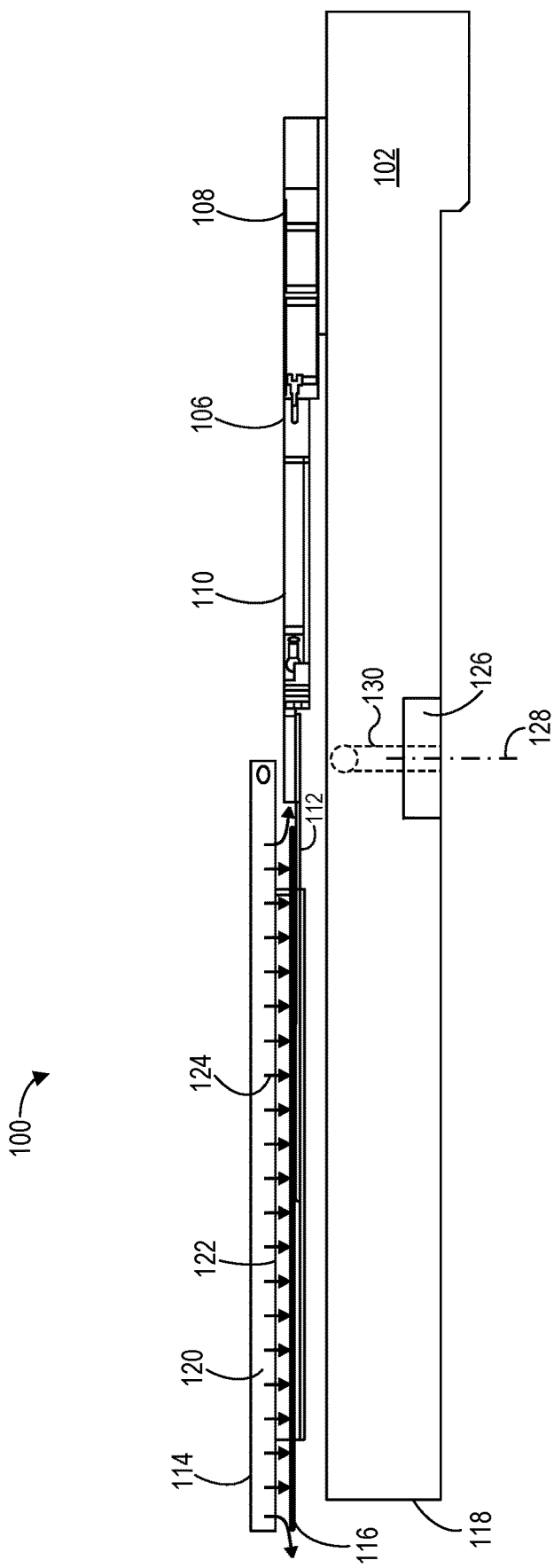
FIG. 1C is a cross-sectional side view of the substrate-handling robot of FIGS. 1A and 1B, with the substrate on the end effector at the retracted position, in accordance with some embodiments.

FIGS. 1A-1C show a substrate-handling robot 100, in accordance with some embodiments. FIGS. 1A and 1B are perspective views of the substrate-handling robot 100, while FIG. 1C is a cross-sectional side view of the substrate-handling robot 100. The substrate-handling robot 100 includes a rotatable platform 102 (e.g., a rotatable box, which may be referred to as a robot box or R-box for short) that rotates in a circle 104 about an axis 128 (FIG. 1C) (e.g., a central axis). For example, the rotatable platform 102 may rotate through a full 360°. The rotatable platform 102 may also be capable of other movement. For example, the rotatable platform 102 may be raised, lowered, and/or translated sideways in a particular direction. The rotatable platform 102 may include an axle 126 for performing the rotation.

An arm 106 and an end-effector 112 are mounted on the rotatable platform 102. The end-effector 112 is coupled (e.g., rigidly connected) to the arm 106 and extends beyond the end of the arm 106, to support a substrate 116. The end-effector 112 is coupled to the rotatable platform 102 by the arm 106, which includes a back portion 108 and a front portion 110. The end-effector thus extends beyond the end of the front portion 110 of the arm 106. In some embodiments, the substrate 116 is a semiconductor wafer. In some embodiments, the end-effector 112 is a fork (e.g., with two prongs) to support the substrate 116 (e.g., the semiconductor wafer).

The arm 106 is translatably coupled to the rotatable platform 102, such that it can move back and forth along the rotatable platform 102 to translate the end-effector 112 and the substrate 116 back and forth between an extended position and a retracted position. The end-effector 112 and the substrate 116 are shown in the retracted position in FIGS. 1A and 1C and in the extended position (i.e., extracted position) in FIG. 1B. In some embodiments, the arm 106 is translatable in a radial direction with respect to the rotatable platform 102 (e.g., with respect to the axis 128, FIG. 1C), to translate the end-effector 112 and substrate 116 between the extended position and the retracted position. For example, the arm 106 is translatable in a direction that is substantially parallel (e.g., to within manufacturing tolerances) to the side of the rotatable platform 102. The arm 106 may extend beyond the end 118 of the rotatable platform 102 to translate the end-effector 112 and substrate 116 to the extended position, as shown in FIG. 1B. The end-effector 112 and substrate 116 may be positioned beyond the end 118 of the rotatable platform 102 when in the extended platform and above the rotatable platform 102 (e.g., above the end 118) in the retracted position. The arm 106 may extend beyond the end 118 of the rotatable platform 102 with the end-effector 112 and substrate 116 in the extended position but not with the end-effector 112 and substrate 116 in the retracted position. The arm 106 may be positioned above the rotatable platform 102 with the end-effector 112 and substrate 116 in the retracted position. The rotatable platform 102 may include a motor (e.g., inside the box of the rotatable platform 102) to move the arm 106 and thus translate the end-effector 112 and substrate 116.

An enclosure 114 at least partially encloses the substrate 116 in the retracted position (i.e., with the substrate 116 loaded on the end-effector 112 in the retracted position). In some embodiments, the enclosure 114 is coupled (e.g., rigidly connected) to the rotatable platform 102 (e.g., at or adjacent to the end 118). The enclosure 114 does not enclose the rotatable platform 102, however, in accordance with some embodiments. Rotation of the rotatable platform 102 rotates the enclosure 114, along with the arm 106 and end-effector 112. The enclosure 114 may have a fixed position on the rotatable platform 102 (e.g., at or adjacent to the end 118). In some embodiments, the enclosure 114 has a top portion that covers the substrate 116 and/or side walls that enclose the substrate 116 on respective sides, with the substrate 116 in the retracted position. (The top portion of the enclosure 114 is shown without fill in FIGS. 1A and 1B to reveal underlying structures.) The enclosure 114 does not cover or enclose the entire arm 106 with the substrate in the retracted position, however, although it may or may not enclose a portion of the arm 106 (e.g., an end of the front portion 110), in accordance with some embodiments. The enclosure 114 may have a side opening (e.g., parallel to the end 118 of the rotational platform 102) through which the substrate 116, end-effector 112, and a portion of the arm 106 pass when being translated from the retracted position to the extended position.

The enclosure 114 includes a shower to provide a flow of purge gas 124 to the substrate. In some embodiments, the purge gas 124 is nitrogen ($N_2$). In some embodiments, the shower includes one or more porous surfaces through which purge gas 124 flows. For example, an inner surface 122 (FIG. 1C) of a top portion of the enclosure 114, or a portion thereof, is porous. The inner surface 122 is positioned to face a surface of the substrate 116 when the substrate 116 is loaded on the end-effector 112 with the end-effector 112 and the substrate 116 in the retracted position. The purge gas 124 flows through the inner surface 122 (i.e., through the pores in the inner surface 122) onto the surface of the substrate 116.

The shower may further include a chamber 120 in the top portion of the enclosure 114. The chamber 120 is surrounded by surfaces including the inner surface 122, an outer surface of the top portion of the enclosure 114, and side surfaces of the top portion of the enclosure 114. The purge gas 124 is provided to the chamber 120, from where it flows through the inner surface 122. In some embodiments, one or more tubes 130 (FIG. 1C) provide the purge gas 124 to the chamber 120. The one or more tubes 130 may extend through the box of the rotational platform 102. (The connection between the rotational platform 102 and the enclosure 114 for the one or more tubes 130 is not visible in the cross-section of FIG. 1C. An example of such a connection is the elbow 218, discussed below with respect to FIG. 2.)

In some embodiments, the enclosure 114 is not hermetically sealed. For example, the enclosure 114 has the side opening through which the substrate 116, end-effector 112, and portion of the arm 106 pass and through which the purge gas 124 may flow. The flow of purge gas 124 provided by the shower may be continuous. For example, the flow of purge gas 124 may be continuous while the end-effector 112 and substrate 116 are in the retracted position, and may continue when the end-effector 112 and substrate 116 are not in the retracted position.

Figure 2:
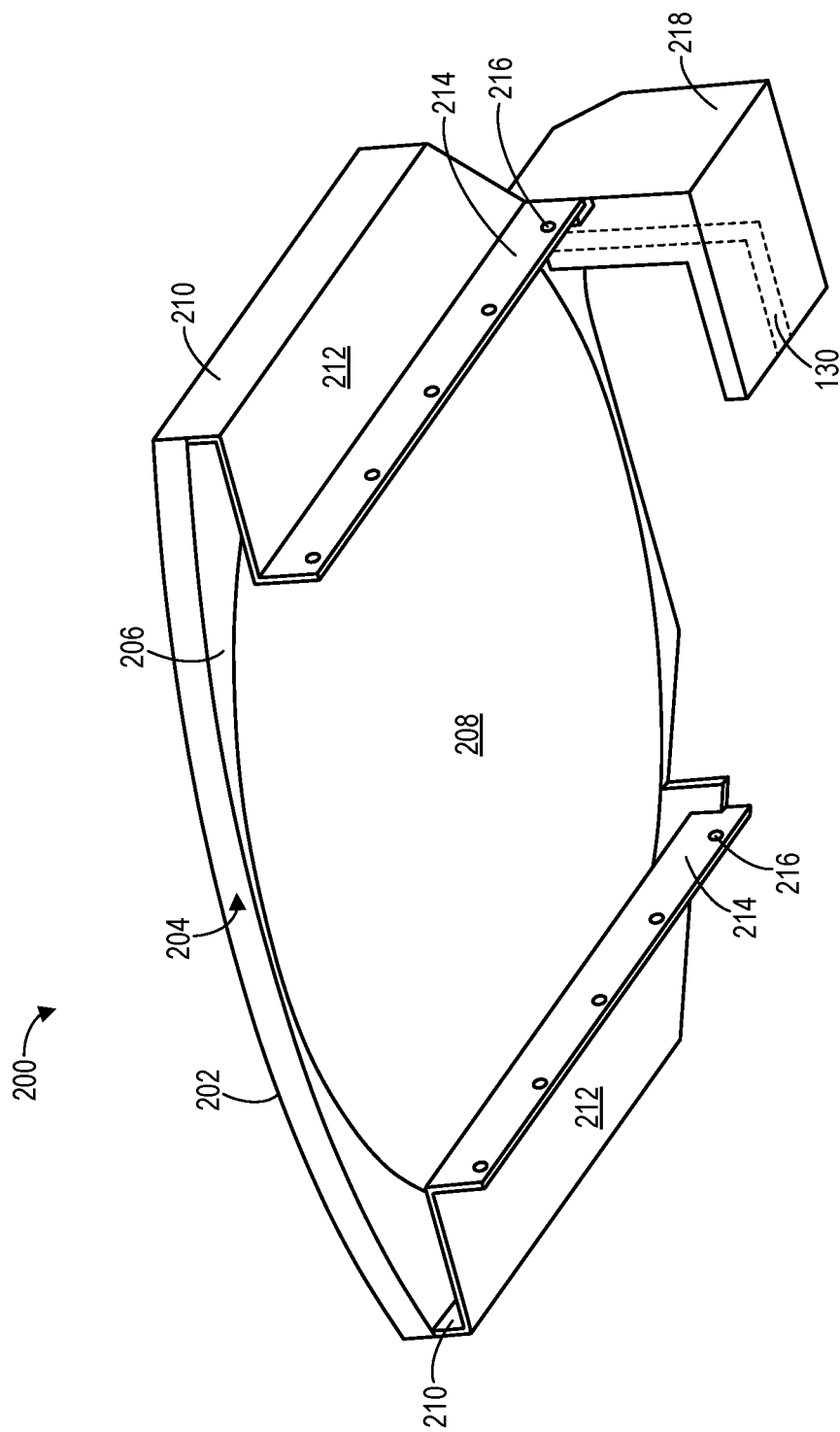
FIG. 2 is a perspective view of an enclosure, in accordance with some embodiments.

FIG. 2 is a perspective view of an enclosure 200, in accordance with some embodiments. The enclosure 200 is an example of the enclosure 114 (FIGS. 1A-1C). A top portion 202 of the enclosure 200 has a chamber 204, which is an example of the chamber 120 (FIG. 1C). An inner surface 206 of the top portion 202, which is an example of the inner surface 122 (FIG. 1C), includes a porous surface 208. The porous surface 208 is positioned to face a surface of a substrate 116 when the substrate 116 is loaded on the end-effector 112 with the end-effector 112 and the substrate 116 in the retracted position. Purge gas 124 passes from the chamber 204 through the porous surface 208 onto the surface of the substrate 116 (FIGS. 1A-1C).

The enclosure 200 further includes side walls 210 that connect to (e.g., form part of) the top portion 202 of the enclosure 200. In some embodiments, respective portions of the side walls 210 are side surfaces of the chamber 204. The side walls 210 connect to brackets 214 that are used to connect the enclosure 200 to a rotatable platform 102 (FIGS. 1A-1C). For example, the brackets 214 include holes 216 into which connectors (e.g., screws, bolts, etc.) are inserted to connect the brackets 214 to respective sides of the box of the rotatable platform 102. The brackets 214 may be connected to the side walls 210 by surfaces 212, which may slant downward and inward from the side walls 210 to the brackets 214. A substrate 116 on an end-effector 112 may be inserted into the enclosure 200 (e.g., retracted into the enclosure 200 by an arm 106, FIGS. 1A-1C) in the space between the inner surface 206 (e.g., including the porous surface 208) on one side and the surfaces 212 as well as the top of the rotational platform 102 on the other side. The end-effector 112, on which the substrate 116 is loaded, may also be housed in this space when it is in the retracted position.

In some embodiments one or both of the side walls 210 may include inner surfaces, all or a portion of which may be porous. These porous surfaces may be used instead of or in addition to the porous surface 208 to provide the flow of purge gas 124 to the substrate 116. The porous surface 208 may be absent. The purge gas 124 may be provided to the porous surfaces of the side walls 210 through the chamber 204.

An elbow 218 is connected to the enclosure 200 (e.g., to the top portion 202) and is connectable to the rotational platform 102 (e.g., to the box of the rotational platform 102), in accordance with some embodiments. The elbow 218 provides a pathway for the one or more tubes 130 (FIG. 1C) to provide the purge gas 124 to the chamber 204. The one or more tubes 130 may extend through the elbow 218. For example, the one or more tubes 130 extend through the box of the rotational platform 102 and through the elbow 218 to the chamber 204.

FIG. 3 is a flowchart showing a substrate-handling method 300 in accordance with some embodiments. In the method 300, a substrate (e.g., substrate 116, FIGS. 1A-1C) is loaded (302) onto an end-effector (e.g., end-effector 112, FIGS. 1A-1C) coupled to an arm (e.g., arm 106, FIGS.

1A-1C), with the arm in an extended position (e.g., as shown in FIG. 1B). In some embodiments, the substrate is a semiconductor wafer, the end-effector includes a fork, and the fork picks up (304) the semiconductor wafer.

With the substrate loaded onto the end-effector, the arm is retracted (306) to a retracted position. In the retracted position, the substrate is at least partially enclosed in an enclosure (e.g., enclosure 114, FIGS. 1A-1C; enclosure 200, FIG. 2) that includes a shower. In some embodiments, the shower includes (308) a porous surface. For example, the enclosure has a top portion (e.g., top portion 202, FIG. 2) with an inner surface (e.g., inner surface 206, FIG. 2) that includes the porous surface (e.g., porous surface 208, FIG. 2). A surface of the substrate is positioned (310) to face the inner surface. In another example, the enclosure has a side wall (e.g., a side wall 210, FIG. 2) with an inner surface that includes the porous surface. The substrate is positioned (312) adjacent to the inner surface.

With the substrate at least partially enclosed in the enclosure, a flow of purge gas (e.g., purge gas 124, FIG. 1C) is provided (314) through the shower to the substrate. For example, the flow of purge gas is continuously provided. In some embodiments, providing the flow of purge gas includes causing (316) the purge gas to flow through the porous surface. For example, the purge gas is provided (318) through one or more tubes (e.g., one or more tubes 130, FIGS. 1C and 2) to a chamber (e.g., chamber 120, FIG. 1C; chamber 204, FIG. 2) that is surrounded by surfaces that include the porous surface (e.g., by surfaces including the inner surface, wherein the porous surface is all or a portion of the inner surface). The purge gas flows from the chamber through the porous surface onto the substrate.

In some embodiments, the arm and the enclosure are mounted on a rotatable platform (e.g., rotatable platform 102, FIGS. 1A-1C). The method 300 may include rotating the rotatable platform while providing the flow of purge gas through the shower to the substrate. For example, the substrate is loaded (302) onto the end-effector with the rotatable platform at a first orientation. The rotatable platform is rotated (320) from the first orientation to a second orientation. The flow of purge gas is provided through the shower to the substrate while rotating the rotatable platform. With the rotatable platform in the second orientation, the substrate is moved (322) to a station. Moving the substrate to the station includes extending the arm from the retracted position to the extended position, thereby removing the substrate from the enclosure. The station may be a second station that corresponds to the second orientation. The method 300 may include moving the substrate to the second station from a first station that corresponds to the first orientation. For example, the substrate may be picked up from the first station in operations 302 and 306.

In some embodiments, the rotatable platform includes a box. The one or more tubes that provide the purge gas to the shower extend through the box (e.g., as shown in FIG. 1C). For example, the one or more tubes may extend through the box and through an elbow (e.g., elbow 218, FIG. 2) coupled between the rotational platform and the enclosure.

The method 300 can include more or fewer operations than shown in FIG. 3. Performance of two or more operations may overlap, and two or more operations may be combined into a single operation.

The enclosure 114 (FIGS. 1A-1C) (e.g., the enclosure 200, FIG. 2) acts as a localized purge module. The enclosure 114 and the method 300 allow purging to be performed locally with respect to the substrate, and thus to be performed precisely. This local purging also uses a relatively low flow of purging gas, as compared for example to the gas flow used to purge the entire equipment front-end module that contains the wafer-handler robot. Furthermore, the expense and complexity of a full-robot enclosure are avoided, in accordance with some embodiments.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A substrate-handling robot, comprising:
an end-effector to support a substrate;
an arm, coupled to the end-effector, to translate the end-effector between an extended position and a retracted position;
a rotatable platform on which the arm is mounted; and
an enclosure, mounted on the rotatable platform, to at least partially enclose the substrate with the substrate on the end-effector in the retracted position, the enclosure comprising a shower to provide a flow of purge gas to the substrate.

2. The robot of claim 1, wherein:
the arm is translatable in a radial direction with respect to the rotatable platform, to translate the end-effector between the extended position and the retracted position; and
the enclosure has a fixed position on the rotatable platform.

3. The robot of claim 2, wherein:
the enclosure is rigidly connected to the rotatable platform; and
the arm is extendable beyond an end of the rotatable platform to translate the end-effector to the extended position.

4. The robot of claim 1, wherein the shower comprises a porous surface through which the purge gas is to flow.

5. The robot of claim 4, wherein:
the enclosure comprises a top portion having an inner surface comprising the porous surface; and
the inner surface is positioned to face a surface of the substrate with the substrate on the end-effector in the retracted position.

6. The robot of claim 5, wherein the shower further comprises a chamber in the top portion of the enclosure, the chamber being surrounded by surfaces including the inner surface.

7. The robot of claim 6, further comprising one or more tubes to provide the purge gas to the chamber.

8. The robot of claim 7, wherein:
the rotatable platform comprises a box on which the arm and the enclosure are mounted;
the robot further comprises an elbow coupled between the box and the enclosure; and
the one or more tubes extend through the box and the elbow.

9. The robot of claim 5, wherein the enclosure further comprises:
side walls, connected to the top portion of the enclosure; and brackets, connected to the side walls, to connect the enclosure to the rotatable platform.

10. The robot of claim 4, wherein the enclosure comprises a first side wall having an inner surface comprising the porous surface.

11. The robot of claim 10, wherein:
the porous surface is a first porous surface;
the shower further comprises a second porous surface through which the purge gas is to flow;
the enclosure comprises a second side wall having an inner surface; and
the inner surface of the second side wall comprises the second porous surface.

12. The robot of claim 1, wherein:
the substrate is a semiconductor wafer; and
the end-effector comprises a fork to hold the semiconductor wafer.

13. A method, comprising:
loading a substrate onto an end-effector coupled to an arm, with the arm in an extended position, wherein the arm is mounted on a rotatable platform;
with the substrate loaded onto the end-effector, retracting the arm to a retracted position, wherein retracting the arm comprises at least partially enclosing the substrate in an enclosure comprising a shower, the enclosure being mounted on the rotatable platform; and
with the substrate at least partially enclosed in the enclosure, rotating the rotatable platform and providing a flow of purge gas through the shower to the substrate.

14. The method of claim 13, wherein:
the loading is performed with the rotatable platform at a first orientation;
the rotating comprises rotating the rotatable platform from the first orientation to a second orientation;
providing the flow of purge gas through the shower to the substrate comprises providing the flow of purge gas while rotating the rotatable platform; and
the method further comprises, with the rotatable platform in the second orientation, moving the substrate to a station, comprising extending the arm from the retracted position to the extended position, wherein extending the arm comprises removing the substrate from the enclosure.

15. The method of claim 13, wherein:
the shower comprises a porous surface; and
providing the flow of purge gas through the shower comprises causing the purge gas to flow through the porous surface.

16. The method of claim 15, wherein:
the enclosure comprises a top portion having an inner surface comprising the porous surface; and
enclosing the substrate in the enclosure comprises positioning a surface of the substrate to face the inner surface.

17. The method of claim 16, wherein:
the shower further comprises a chamber in the top portion of the enclosure, the chamber being surrounded by surfaces including the inner surface; and
providing the flow of purge gas comprises providing the purge gas to the chamber through one or more tubes.

18. The method of claim 17, wherein:
the rotatable platform comprises a box;
the one or more tubes extend through the box; and
the rotating comprises rotating the rotatable platform while providing the flow of purge gas through the shower to the substrate.

19. The method of claim 15, wherein:
the enclosure comprises a first side wall having an inner surface comprising the porous surface; and
enclosing the substrate in the enclosure comprises positioning the substrate adjacent to the inner surface.

20. The method of claim 13, wherein:
the substrate is a semiconductor wafer;
the end-effector comprises a fork; and
loading the substrate onto the end-effector comprises picking up the semiconductor wafer with the fork.

\* \* \* \* \*